(12) United States Patent
August, Jr.

(10) Patent No.: US 6,188,017 B1
(45) Date of Patent: Feb. 13, 2001

(54) ELECTROMAGNETIC INTERFERENCE (EMI) SHIELDING APPARATUS

(75) Inventor: Joseph M. August, Jr., Elgin, IL (US)

(73) Assignee: 3Com Corporation, Rolling Meadows, IL (US)

( * ) Notice: Under 35 U.S.C. 154(b), the term of this patent shall be extended for 0 days.

(21) Appl. No.: 09/307,364

(22) Filed: May 7, 1999

(51) Int. Cl.[7] ....................................... H05K 9/00
(52) U.S. Cl. .................... 174/35 GC; 439/939; 361/753; 361/799; 361/818; 174/35 C
(58) Field of Search ................... 174/35 GC, 51, 174/35 R, 35 C; 361/816, 818, 753, 799; 439/927, 939, 559

(56) References Cited

U.S. PATENT DOCUMENTS 5,317,105 * 5/1994 Weber .............................. 174/35 GC
5,980,275 * 11/1999 Beaman et al. ......................... 439/92

* cited by examiner

Primary Examiner—Kristine Kincaid
Assistant Examiner—Hung V Ngo
(74) Attorney, Agent, or Firm—Baniak Pine & Gannon

(57) ABSTRACT

An apparatus and method for shielding electromagnetic interference (EMI) includes a circuit board assembly having a bracket and a circuit board attached to the bracket. The circuit board includes a connector for insertion through an opening in the bracket. A compressible member having an outer conductive portion is positioned between the connector and an inner surface of the bracket to prevent electromagnetic emissions from exiting through the opening in the bracket.

12 Claims, 2 Drawing Sheets

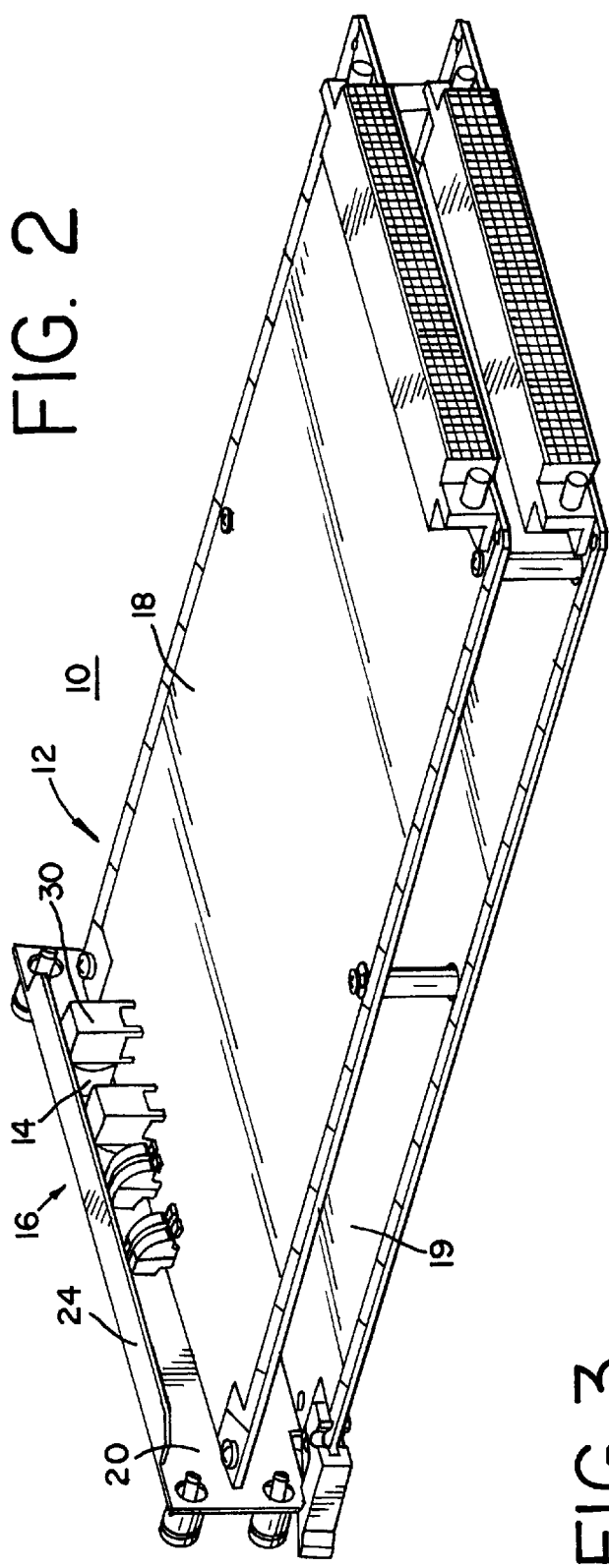
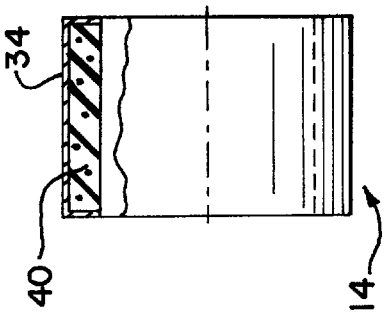
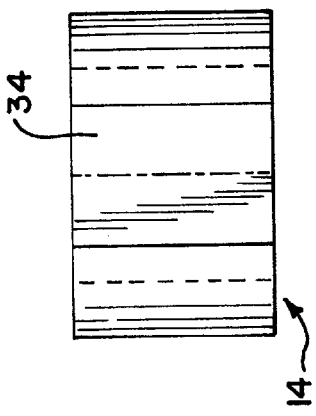
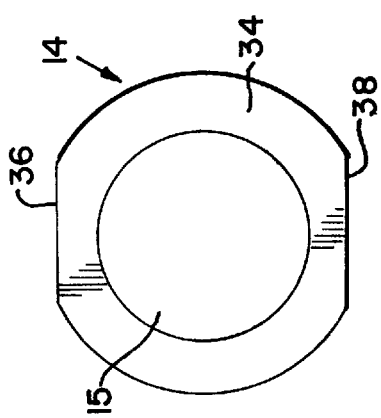

ELECTROMAGNETIC INTERFERENCE (EMI) SHIELDING APPARATUS

FIELD OF THE INVENTION

This invention relates generally to the field of electromagnetic interference (EMI) shields, and in particular, to an EMI shield for a circuit board assembly that prevents unacceptable levels of electromagnetic radiation from exiting the circuit board assembly.

BACKGROUND OF THE INVENTION

Electronic chassis typically include a plurality of circuit board assemblies. Each circuit board assembly is comprised of at least one printed circuit board that is attached to C-shaped channel member that serves as the faceplate for the assembly. The printed circuit board typically includes at least one surface mounted connector (such as, for example, an F-series connector). The channel member typically has at least one opening therein to allow a portion of the connector to extend through the opening in the bracket to enable a technician to plug an input cable or cord into the connector.

When the connector is inserted through the opening in the channel, the gap around the opening in the bracket must be properly sealed to prevent electromagnetic radiation generated by the electronic components of the printed circuit board from exiting through the channel. Excessive electromagnetic interference (EMI) is a widespread problem in many electronic devices, especially in high-speed telecommunication and networking applications. These electronic devices must meet very stringent emissions standards in the United States and in other foreign countries.

Shielding components are available which can be used to reduce EMI emissions that exit through an opening formed in the channel member. Typically, a flat metal nut is positioned over the connector on the outer surface of the channel member, and is mechanically attached to the channel. There are several disadvantages to this arrangement, including increased manufacturing costs associated with having to use fastening tools to manually fasten these nuts to the channel. The installation of these nuts with fastening tools may also create unacceptable loads on the solder joints of the connectors, which may cause the joints to fail. Moreover, rigid metal nuts do not provide any flexibility to compensate for components that are out of tolerance, which may result in excessive amounts of electromagnetic radiation exiting the assembly through gaps formed between the components.

In addition, flat metal nuts typically occupy a considerable amount of space on the outer surface of the channel, which limits the number of available input/output connections and the amount of artwork on the outer surface. Also, the outer surface of the channel must be masked before painting to ensure that there is metal to metal contact between the nut and the surface of the channel. Once installed, the nut itself typically has to be painted to match the color of the outer surface. This two step painting process also increases manufacturing costs.

Accordingly, it would be desirable to have an EMI shielding apparatus that overcomes the disadvantages described above, and to provide a simple and cost effective EMI shielding apparatus.

SUMMARY OF THE INVENTION

One aspect of the invention provides an electromagnetic interference (EMI) shielding apparatus. A circuit board assembly includes a bracket and a circuit board attached to the bracket. The circuit board includes a connector for insertion through an opening in the bracket. A compressible member includes an outer conductive portion and is positioned between the connector and an inner surface of the bracket. The compressible member is in contact with the connector and the inner surface of the bracket to prevent electromagnetic emissions from exiting through the opening in the bracket. The compressible member may preferably be comprised of a foam body and may preferably compress between 5% to 60%. The compressible member may preferably include an opening formed therein for receiving the connector. The outer conductive portion may preferably be comprised of metalized fabric. The outer conductive portion of the compressible member may preferably be in contact with the inner surface of the bracket. The bracket may preferably include a flange portion, and the outer conductive portion of the compressible member may preferably be in contact with the flange portion. The outer conductive portion of the compressible member may preferably include a first flat surface in contact with the flange portion. The outer conductive portion of the compressible member may preferably be in contact with the circuit board to provide continuous electrical grounding between the circuit board and the bracket. The outer conductive portion of the compressible member may preferably include a second flat surface in contact with the circuit board.

Another aspect of the invention provides a method of shielding electromagnetic interference (EMI). A circuit board assembly including a bracket and a circuit board attached to the bracket is provided. The circuit board includes a connector for insertion through an opening in the bracket. A compressible member includes an outer conductive portion. The compressible member is positioned between the connector and an inner surface of the bracket. The compressible member is compressed, and electromagnetic emissions are prevented from exiting through the opening in the bracket. The outer conductive portion of the compressible member may preferably be in contact with the circuit board and the circuit board may preferably be grounded to the bracket.

Another aspect of the invention provides a method of assembling an electromagnetic interference (EMI) shielding apparatus. A circuit board assembly including a bracket and a circuit board is provided. The circuit board includes a connector. A compressible member includes an outer conductive portion. The compressible member is positioned between the connector and an inner surface of the bracket. A portion of the connector is positioned through an opening in the bracket and the compressible member is compressed between the connector and the inner surface of the bracket. The circuit board is fastened to the bracket. The circuit board may preferably be in contact with the compressible member. A flange portion of the bracket may preferably be in contact with the compressible member.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 2 is an assembled view of the embodiment of FIG. 1;

FIG. 3 is a front view of the compressible member of the embodiment of FIG. 1;

FIG. 4 is a top view of the compressible member of FIG. 2; and

FIG. 5 is a side view of the compressible member of FIG. 2 with a portion broken away to show the foam body and the outer conductive portion.

DETAILED DESCRIPTION OF THE PRESENTLY PREFERRED EMBODIMENTS

Figure 1:
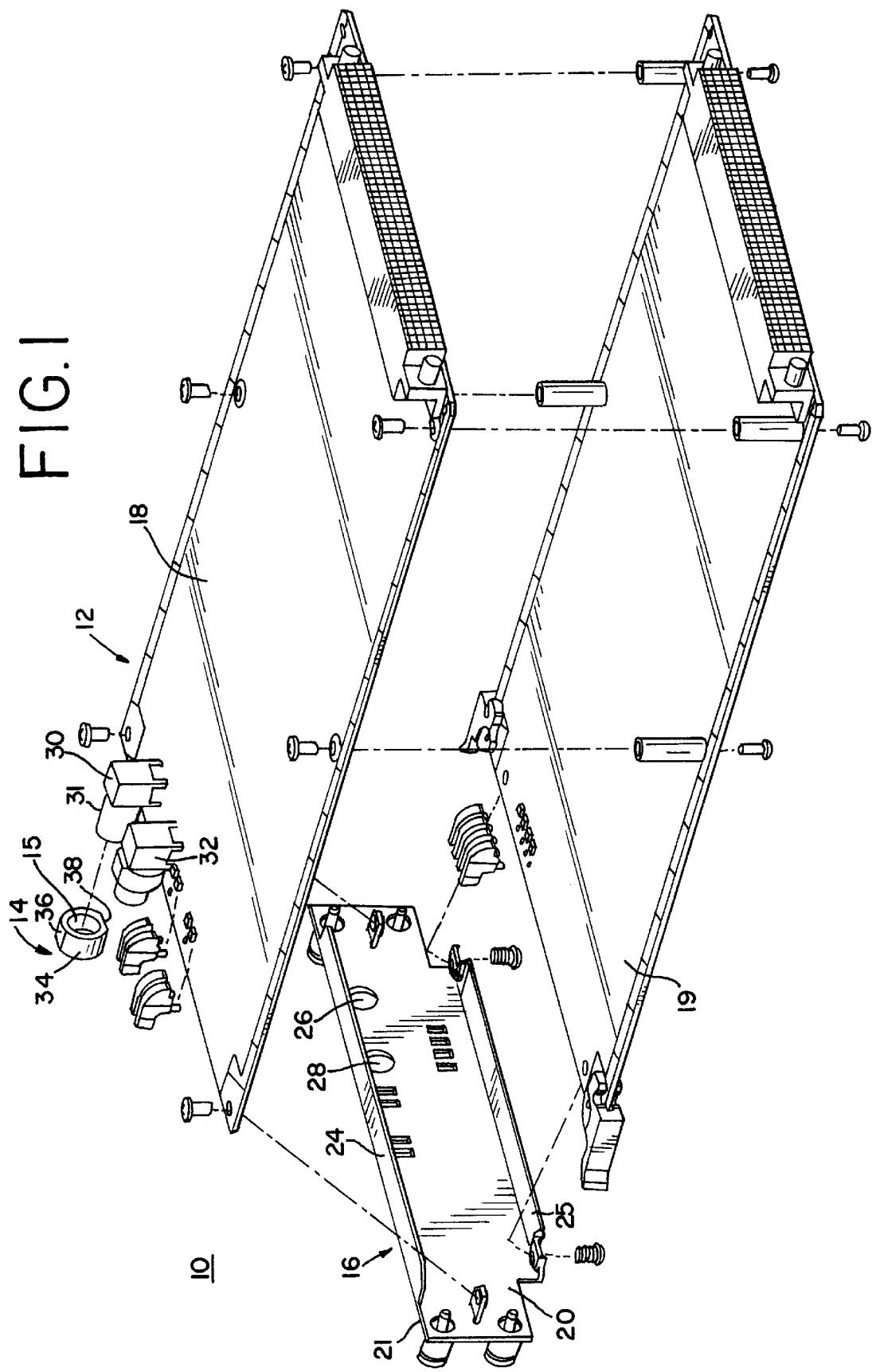
FIG. 1 is a perspective exploded view of a preferred embodiment of an electromagnetic interference (EMI) shielding apparatus that is made in accordance with the invention.

As shown in FIGS. 1–2, a preferred embodiment of an electromagnetic interference (EMI) shielding apparatus 10 includes a circuit board assembly 12 and a compressible member 14. The circuit board assembly 12 may preferably be any circuit board assembly that is slidably positioned in an electronic chassis (not shown) for high speed telecommunication and networking applications. The circuit board assembly 12 includes a bracket 16 and a circuit board 18 attached to the bracket 16. As shown in FIG. 1, a second circuit board 19 may also be attached to the bracket 16. The bracket 16 serves as a faceplate for the circuit board assembly 12. The size and shape of the bracket 16 may vary depending on the size and configuration of the circuit board 18. The bracket 16 may preferably be any suitable rigid material such as, for example, metal.

As shown in FIGS. 1–2, the bracket 16 includes an inner surface 20 and a flange portion 24 that extends along the length of the bracket 16. As shown in FIG. 2, the bracket 16 may also preferably include a second flange portion 25 opposite flange portion 24. Referring to FIG. 1, an opening 26 is formed in the bracket 16 to receive a connector 30 mounted on the circuit board 18. A second opening 28 may preferably be formed in the bracket 16 to receive a second connector 32. The number of openings in the bracket 16 may vary depending upon the number of connectors mounted in the circuit board 18.

Referring to FIG. 1, the connector 30 is positioned on the circuit board 18 for insertion through the opening 26 in the bracket 16. The connector 30 may preferably be surface mounted to the circuit board 18. The circuit board 18 may preferably be any conventional printed circuit board. The connector 30 may preferably be any electronic connector such as, for example, a right-angled F-Series Connector.

As shown in FIGS. 3–5, the compressible member 14 includes an outer conductive portion 34. In the embodiment shown in FIGS. 1–2, the compressible member 14 is positioned between the connector 30 and the inner surface 20 of the bracket 16. When assembled, the compressible member 14 is in contact with the connector 30 and the inner surface 20 of the bracket (see FIG. 2) to prevent electromagnetic emissions from exiting through the opening 26 in the bracket 16.

The compressible member 14, as manufactured by, for example, Advanced Performance Materials (Part No. 4081-EA-715-00050) may preferably have a foam body 40 that is covered by the outer conductive portion 34 (see FIG. 5). The foam material may preferably be rated to comply with UL requirements, and in particular, UL1950. The outer conductive portion 34 of compressible member 14 may preferably be comprised of metalized fabric. The compressible member 14 may preferably compress between 5% to 60%. For the embodiment shown in FIGS. 1–2, the compressible member 14 has been found to provide maximum shielding effectiveness when compressed at least about 30%. The inherent flexibility of the compressible member 14 prevents excessive amounts of electromagnetic radiation from exiting the assembly 12 through gaps between components that are out of tolerance.

As shown in FIGS. 1 and 3, the compressible member 14 includes an opening 15 formed therein for receiving the connector 30. When assembled, the outer conductive portion 34 of the compressible member 14 is in contact with the inner surface 20 of the bracket 16. The outer conductive portion 34 of the compressible member 34 is also in contact with the flange portion 24. The advantage of this arrangement is that the compressible member 14 provides continuous electrical grounding between the circuit board 18 and the bracket 16. The bracket 16 is therefore grounded to the electronic chassis (not shown) when the circuit board assembly 12 is installed in the chassis.

As shown in FIGS. 1 and 3, the outer conductive portion 34 of the compressible member 14 includes a first flat surface 36 and a second flat surface 38. The first flat surface 36 is in contact with the flange portion 24, and the second flat surface is in contact with circuit board 18. The flat surfaces ensure the electrical grounding between the circuit board 18 and the bracket 16.

During the assembly process, the compressible member 14 is positioned between the connector 30 and an inner surface 20 of the bracket 16. In the embodiment shown in FIGS. 1–2, the compressible member 14 is positioned so that the stem portion 31 of the connector 30 is inserted through the opening 15 in the compressible member 14. The bracket 16 is then positioned so that the stem portion 31 of the connector 30 is inserted through the opening 26 in the bracket 16. As the bracket 16 is brought into close proximity with the circuit board 18, the compressible member 14 is compressed between the connector 30 and the inner surface 20 of the bracket 16. The compressible member 14 contacts the circuit board 18 and the flange portion 24 of the bracket 16 thereby electrically grounding the circuit board 18 to the bracket 16. The circuit board 18 is then fastened to the bracket 16. No tools are required to install the compressible member 14. As a result, no unacceptable loads are placed on the solder joints of the connector 30. Moreover, the placement of the compressible member 14 between the connector 30 and the inner surface 20 of the bracket 16 results in more space on the outer surface 21 of the bracket 16 for additional input/output connections and artwork. Moreover, the need for masking of the outer surface 21 and the two step painting process is eliminated thereby reducing manufacturing costs.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. An electromagnetic interference (EMI) shielding apparatus comprising:

a circuit board assembly, the circuit board assembly including a bracket and a circuit board attached to the bracket, the bracket including an end wall having an inner surface, the bracket further including a flange portion having an inner surface, the flange portion extending outward perpendicular from the end wall, the circuit board including a connector inserted through an opening in the end wall of the bracket, a cylindrical compressible member including an outer conductive portion, the cylindrical compressible member positioned between the connector and the bracket, the cylindrical compressible member in contact with the connectors, the inner surface of the flange portion, the inner surface of the end wall, and the circuit board to prevent electromagnetic emissions from exiting through the opening in the end wall of the bracket.

2. The apparatus of claim 1 wherein the cylindrical compressible member comprises a foam body.

3. The apparatus of claim 1 wherein the outer conductive portion comprises metalized fabric.

4. The apparatus of claim 1 wherein the cylindrical compressible member compresses between 5% to 60%.

5. The apparatus of claim 1 wherein the cylindrical compressible member compresses at least about 30%.

6. The apparatus of claim 1 wherein the cylindrical compressible member includes an opening formed therein for receiving the connector.

7. The apparatus of claim 1 wherein the outer conductive portion of the cylindrical compressible member is in contact with the connector, the inner surface of the flange portion, the inner surface of the end wall, and the circuit board to provide continuous electrical grounding between the circuit board and the bracket.

8. The apparatus of claim 1 wherein the outer conductive portion of the cylindrical compressible member includes a first flat surface, the first flat surface in contact with the inner surface of the flange portion.

9. The apparatus of claim 8 wherein the outer conductive portion of the cylindrical compressible member includes a second flat surface, the second flat surface in contact with the circuit board.

10. A method of shielding electromagnetic interference (EMI) comprising:

providing a circuit board assembly, the circuit board assembly including a bracket and a circuit board attached to the bracket, the bracket including an end wall having an inner surface, the bracket further including a flange portion having an inner surface, the flange portion extending outward perpendicular from the end wall, the circuit board including a connector inserted through an opening in the end wall of the bracket, a cylindrical compressible member including an outer conductive portion;

positioning the compressible member between the connector and the bracket;

contacting the cylindrical compressible member against the connector, the inner surface of the flange portion, the inner surface of the end wall, and the circuit board;

compressing the compressible member; and preventing electromagnetic emissions from exiting through the opening in the end wall of the bracket.

11. The method of claim 10 further comprising:

contacting the outer conductive portion of the cylindrical compressible member against the connector, the inner surface of the flange portion, the inner surface of the end wall, and the circuit board; and grounding the circuit board to the bracket.

12. A method of assembling an electromagnetic interference (EMI) shielding apparatus comprising:

providing a circuit board assembly, the circuit board assembly including a bracket and a circuit board, the bracket including an end wall having an inner surface, the bracket further including a flange portion having an inner surface, the circuit board including a connector, a cylindrical compressible member including an outer conductive portion;

positioning the cylindrical compressible member between the connector and the bracket;

positioning a portion of the connector through an opening in the end wall of the bracket;

compressing the cylindrical compressible member between the connector, the inner surface of the end wall, the inner surface of the flange portion, and the circuit board; and fastening the circuit board to the bracket.

* * * * *